United States Patent
Bueb et al.

(10) Patent No.: US 11,734,195 B2
(45) Date of Patent: Aug. 22, 2023

(54) ADJUSTABLE MEMORY OPERATION SETTINGS BASED ON MEMORY SUB-SYSTEM OPERATING REQUIREMENTS

(71) Applicant: MICRON TECHNOLOGY, INC., Boise, ID (US)

(72) Inventors: Christopher Bueb, Folsom, CA (US); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/061,850

(22) Filed: Dec. 5, 2022

(65) Prior Publication Data
US 2023/0095179 A1    Mar. 30, 2023

Related U.S. Application Data

(63) Continuation of application No. 16/658,971, filed on Oct. 21, 2019, now Pat. No. 11,544,202.

(51) Int. Cl.
| | |
|---|---|
| *G06F 12/126* | (2016.01) |
| *G06F 12/02* | (2006.01) |
| *G11C 11/409* | (2006.01) |
| *G11C 11/56* | (2006.01) |
| *G06F 11/30* | (2006.01) |

(52) U.S. Cl.
CPC ........ *G06F 12/126* (2013.01); *G06F 11/3058* (2013.01); *G06F 12/0246* (2013.01); *G06F 12/0253* (2013.01); *G11C 11/409* (2013.01); *G11C 11/5628* (2013.01); *G06F 2212/7211* (2013.01)

(58) Field of Classification Search
None
See application file for complete search history.

(56) References Cited

U.S. PATENT DOCUMENTS

| | | |
|---|---|---|
| 2011/0213945 A1 | 9/2011 | Post |
| 2015/0012764 A1 | 1/2015 | Carlson |

*Primary Examiner* — Michael Alsip
(74) *Attorney, Agent, or Firm* — Lowenstein Sandler LLP (57) ABSTRACT

A first set of memory access operations is performed at a memory sub-system based on first operation settings that are configured based on a first operating environment of a host system. A detection is made that the host system is operating in a second operating environment that is different from the first operating environment. A level of impact that each operating requirement of a set of operating requirements of the memory sub-system has on a performance of the memory sub-system in view of the second operating environment. A second set of memory access operations is determined based on a respective priority for each operating requirement of the set of operating requirements. A second set of memory access operations is performed at the memory sub-system based on the second set of memory access operation settings.

20 Claims, 5 Drawing Sheets

ADJUSTABLE MEMORY OPERATION SETTINGS BASED ON MEMORY SUB-SYSTEM OPERATING REQUIREMENTS

RELATED APPLICATIONS

This application is a continuation of U.S. patent application Ser. No. 16/658,971, filed Oct. 21, 2019, the entire contents of which are hereby incorporated by reference herein.

TECHNICAL FIELD

Embodiments of the disclosure relate generally to memory sub-systems, and more specifically, relate to adjustable memory operation settings based on memory sub-system operating requirements.

BACKGROUND

A memory sub-system can be a storage device, a memory module, and a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to adjustable memory operation settings based on memory sub-system operating requirements. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

A conventional memory sub-system can perform various operations with respect to one or more memory components included in the memory sub-system. For example, programming operations, such as read operations, program (i.e., write) operations, and erase operations, can be performed at one or more memory components to program host data at the memory sub-system. In another example, background management operations, such as garbage collection operations, data refresh operations, and wear leveling operations, can be performed at one or more memory components to manage data stored at the memory sub-system. A memory operation, such as the programming operations and background management operations previously described, can be associated with one or more operation settings that affect a performance of the memory operation. For example, a read operation to retrieve data from the memory sub-system can be associated with a read voltage setting, which indicates a voltage to be applied to a data block of the memory sub-system in retrieving the data. In another example, a garbage collection operation can be associated with a garbage collection frequency setting, which indicates a frequency in which a garbage collection operation is to be performed at the memory sub-system.

Conventional memory sub-systems can be used by host systems with a wide variety of applications. As a result, conventional memory sub-systems can be subject to a wide range of host operating requirements. For example, a first memory sub-system can be used in a cellular telephone while a second memory sub-system can be used in a surveillance camera. The operating requirements of the cellular telephone (e.g., high program performance) can be different from the operating requirements of the surveillance camera (e.g., prolonged data retention). However, conventional memory sub-systems do not provide a mechanism for memory operation settings to be configured in accordance with operating requirements of the host system. In accordance with the above described example, the memory operation settings of the first memory sub-system can be the same memory operation settings of the second memory sub-system, even though the cellular telephone and the surveillance camera can have different operating requirements. As a result, memory operations at the memory sub-system are not performed in accordance with operating requirements of the host system, which can decrease the performance of the memory sub-system and increase the latency of read and/or write operations.

Aspects of the present disclosure address the above and other deficiencies by having a memory sub-system that provides adjustable memory operation settings based on operating requirements of the host system. By adjusting memory operation settings based on the operating requirements of the host system, a mechanism is provided for memory operations to be performed in accordance with the operating requirements of the host system. For example, a priority can be determined for each operating requirement of a set of operating requirements associated with an operating environment of the host system. Based on the priority for each operating requirement, a memory operation setting can be determined for a memory operation to be performed the memory sub-system. In some examples, the memory operation can be a programming operation. In response to a request from the host system to perform the programming operation, the programming operation can be performed based on the memory operation setting. In other examples, the memory operation can be a background management operation. The background management operation can be scheduled and/or performed based on the memory operation setting.

Advantages of the present disclosure include, but are not limited to, an improved performance of the memory sub-system as memory operations at the memory sub-system are to be performed in accordance with the operating requirements of the host system. By performing memory operations in accordance with the operating requirements of the host system, the overall read and/or write latency of the memory sub-system can decrease, as programming operations can be performed with fewer errors. Additionally, background management operations can be scheduled and performed such to improve performance of the background management operations, resulting in an improved performance of the memory sub-system overall. Further, by improving a performance of the background management operations, the overall read and/or write latency of the memory sub-system can decrease. By decreasing the read and/or write latency of the memory sub-system, the memory sub-system can be capable of satisfying Quality of Service (QoS) requirements associated with the various operating requirements at the memory sub-system.

Figure 1:
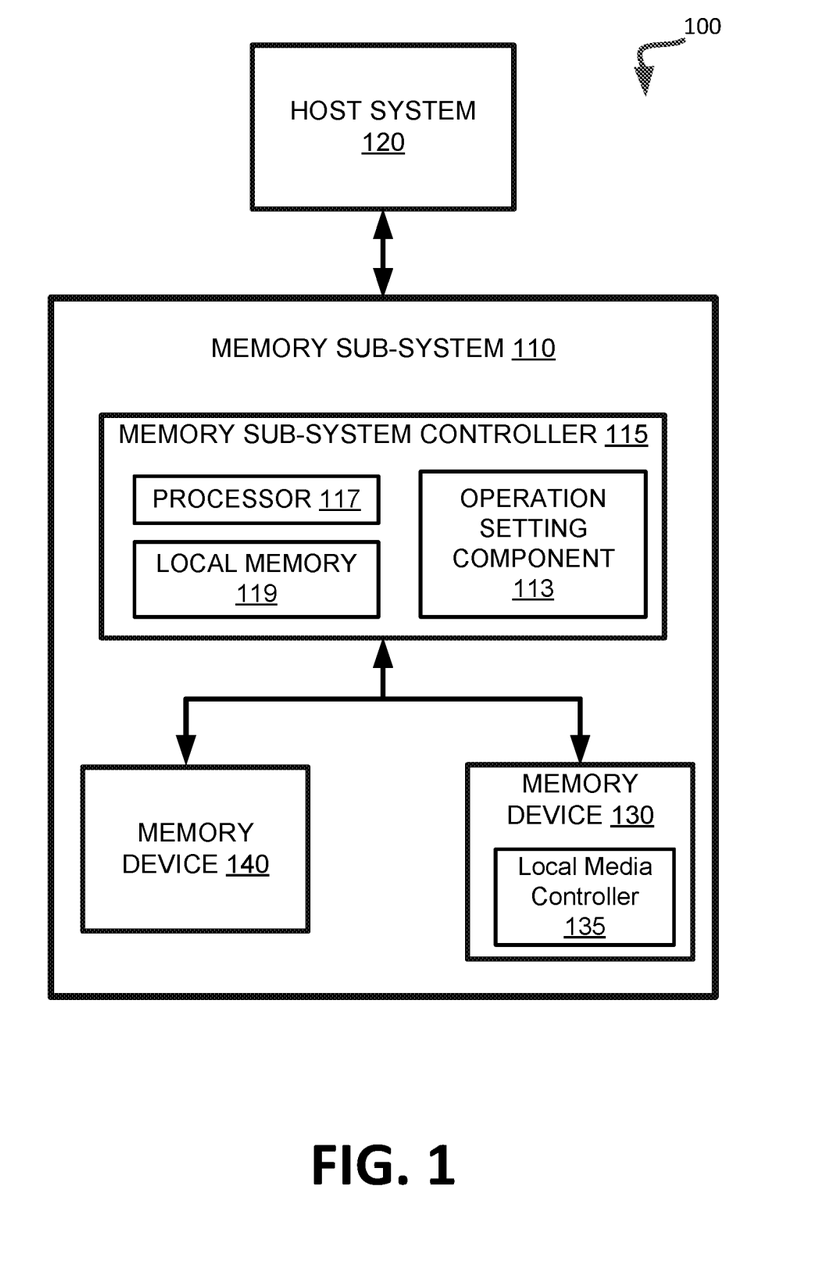
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells such as single level cells (SLCs) or multi-level cells (MLCs) (e.g., triple level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

The memory sub-system 110 includes an operation setting component 113 that can determine one or more memory operation settings based on operating requirements of the host system. In some embodiments, the memory sub-system controller 115 includes at least a portion of the operation setting component 113. For example, the memory sub-system controller 115 can include a processor 117 (processing device) configured to execute instructions stored in local memory 119 for performing the operations described herein. In some embodiments, the operation setting component 113 is part of the host system 110, an application, or an operating system.

The operation setting component 113 can determine a priority for each operating requirement of a set of operating requirements of the memory sub-system. Each operating requirement of the set of operating requirements can correspond with an operating environment of the host system. Based on the priority for each operating requirement, the operation setting component 113 can determine a memory operation setting for a memory operation to be performed at the memory sub-system. The memory operation setting can be determined such that when the memory operation is performed based on the memory operation setting, one or more operating requirements associated with higher priorities than other operating requirements are satisfied. Further details with regards to the operations of the operation setting component 113 are described below.

Figure 2:
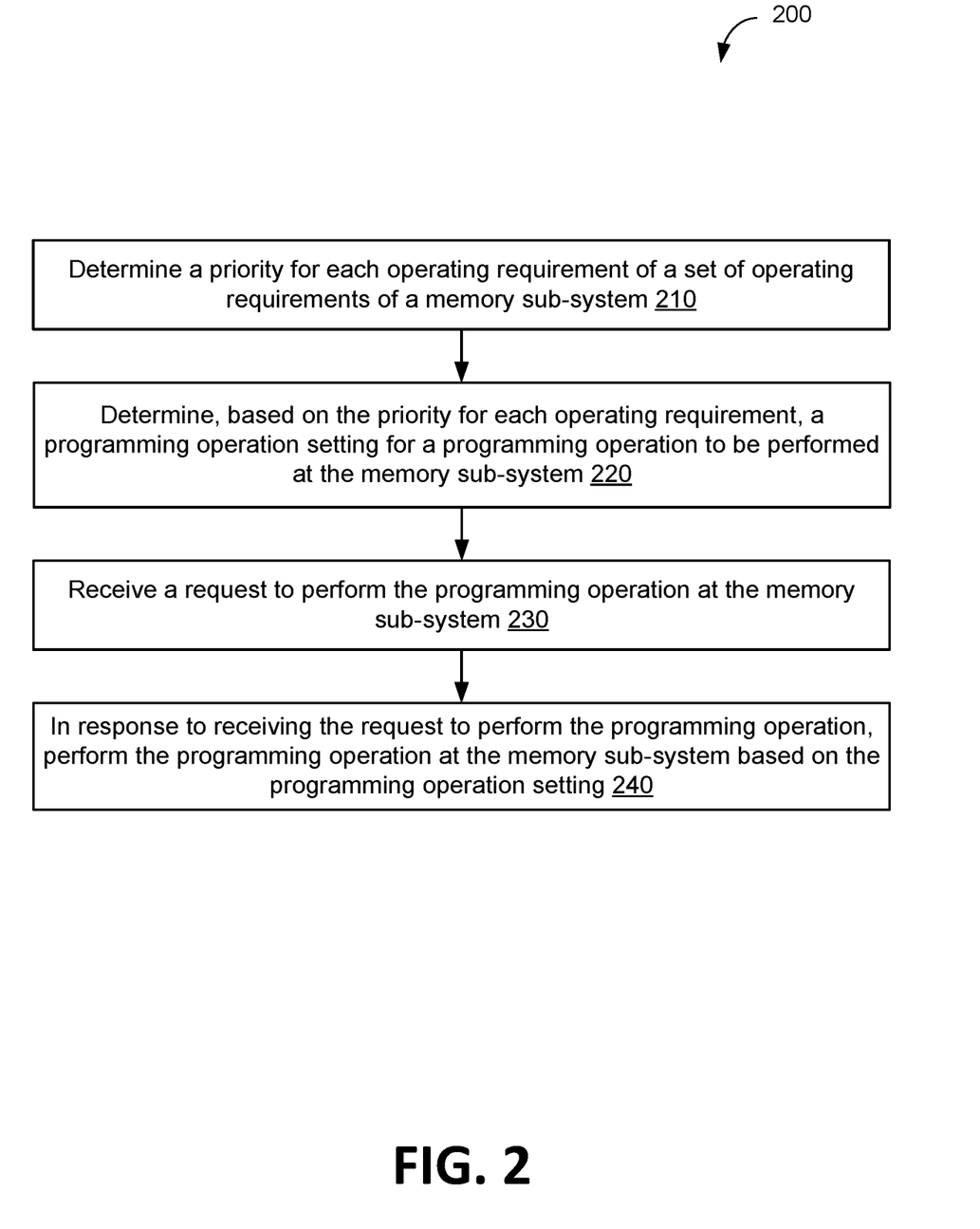
FIG. 2 is a flow diagram of an example method to adjust programming operation settings based on memory sub-system operating requirements in accordance with some embodiments of the present disclosure.

FIG. 2 is a flow diagram of an example method 200 to adjust programming operation settings based on memory sub-system operating system requirements, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the operation setting component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing device determines a priority for each operating requirement of a set of operating requirements of a memory sub-system. Each operating requirement of the set of operating requirements can correspond with an operating environment of a host system, such as host system 120 of FIG. 1. In some embodiments, the set of operating requirements can include at least one of an operating temperature of the memory sub-system, a time period that data is to be retained at the memory sub-system, a program performance of the memory sub-system, or an endurance of the memory sub-system. In the same or alternative embodiments, the operating requirements can include any other operating requirement of a memory sub-system.

The priority for each operating requirement can include a ranking or a weighting for each operating requirement. In one embodiment, the priority for each operating requirement can include a ranking for each operating requirement based on an impact of the operating requirement on a performance of the memory sub-system. In some embodiments, an operating requirement can impact the performance of the memory sub-system if the operating requirement affects at least a read and/or write latency of the memory sub-system, affects a lifespan of the memory sub-system, etc. For example, the operating environment of the host system can be an automobile that operates in cold temperatures (e.g., temperatures that rarely exceed 50° F.). Based on the operating environment of the host system, an operating temperature of the memory sub-system can have a higher impact on the performance of the memory sub-system than other operating requirements for the memory sub-system. As such, the operating temperature of the memory sub-system can be associated with a higher priority than other operating requirements for the memory sub-system.

In other embodiments, the priority for each operating requirement can include an indication of whether each operating requirement has a priority or does not have a priority. In one embodiment, one or more operating requirements that have a higher impact on the performance of the memory sub-system can be associated with a priority, while other operating requirements are not associated with a priority. In accordance with the above described example, the operating temperature of the memory sub-system can be associated with the priority, while the other operating requirements of the memory sub-system are not associated with a priority.

In some embodiments, the priority for each operating requirement can be determined based on a set of operating requirement priorities received from the host system. In one embodiment, a user of the host system can provide a priority for one or more operating requirements of the set of operating requirements in accordance with the operating environment of the host system. In accordance with the previously described example, the operating environment of the host system can be an automobile that operates in cold temperatures. Based on the operating environment, the host system can provide an indication to the processing device that the operating temperature of the memory sub-system has a higher priority than other operating requirements of the memory sub-system. In some embodiments, the indication can include a ranking of the priorities of the operating requirements, where the operating temperature of the memory sub-system is associated with a higher priority. In other embodiments, the indication can provide that the operating temperature of the memory sub-system is associated with a priority, while other operating requirements of the memory sub-system are not associated with a priority.

In some embodiments, the priority for each operating requirement can be determined based on an indication of an operating environment of the host system. The processing device can receive an indication of the operating environment of the host system. Based on the received operating environment, the priority for each operating requirement of the set of operating requirements can be assigned, where a higher priority is assigned to an operating requirement that has a higher impact on a performance of the memory sub-system than other operating requirements of the set of operating requirements.

In accordance with the previously described example, the operating environment of the host system can be an automobile that operates in cold temperatures. The host system can provide an indication to the processing device that the host system operates in cold temperatures. Based on the indication that the host system operates in cold temperatures, the processing device can assign a priority for each operating requirement of the set of operating requirements. For example, a higher priority can be assigned to the operating temperature of the memory sub-system than the other operating requirements based on the indication that the host system operates in cold temperatures.

In another example, the operating environment of the host system can be a surveillance camera where the surveillance camera is to capture surveillance image footage for a period of at least 24 hours and store the captured surveillance image footage for a given period of time. The host system can provide an indication of the operating environment to the processing device. Based on the indication that the host system can be a surveillance camera, the processing device can assign a priority for each operating requirement of the set of operating requirements. For example, a higher priority can be assigned to an operating requirement of a time period for which data is to be retained at the memory sub-system than the other operating requirements, as the time period data is to be retained can have a higher impact on performance of the memory sub-system, with respect to the operating environment of the host system, than other operating requirements.

In some embodiments, one or more parameter values can be received from the host system. The one or more received parameter values can correspond to one or more priorities for each of the set of operating requirements. In accordance with a previously described example, the operating environment of the host system can be an automobile that operates in cold temperatures. The host system can provide a parameter value of an average operating temperature of the host system (e.g., 50° F.). Additionally, the temperature of the automobile can periodically increase to warm temperatures (e.g., temperatures exceeding 50° F.), such as when a driver operates the automobile. In such an example, the host system can provide a parameter value corresponding to an estimation of an amount of time the host system will operate in temperatures exceeding 50° F. In another example, the host system can provide a parameter value corresponding to an estimation of a number of write operation requests that the host system will transmit to the memory sub-system while the temperature of the automobile is below 50° F.

At operation 220, the processing device determines, based on the priority for each operating requirement, a programming operation setting for a programming operation to be performed at the memory sub-system. A programming operation can include a read operation, a write operation, or an erase operation. A programming operation setting can include an initial write mode of host data stored at the memory sub-system, a subsequent write mode of host data stored at the memory sub-system, a read voltage, or a rate at which data is to be written to the memory sub-system. An initial write mode can correspond to a first number of bits per memory cell of the memory sub-system to store host data when the data is initially written to the memory sub-system. A subsequent write mode can correspond to a second number of bits per memory cell of the memory sub-system to store host data that was initially written to the memory sub-system in an initial write mode and is being re-written in the subsequent write mode. In other embodiments, the programming operation setting can include any setting corresponding to a programming operation. In some embodiments, the programming operation setting can also be determined based on one or more parameter values corresponding to the priority for each operating requirement received from the host system.

In accordance with a previously described example, the operating environment of the host system can be an automobile that operates in cold temperatures. The operating temperature of the memory sub-system can be assigned a higher priority than other operating requirements of the memory sub-system. The processing device can also have received, from the host system, a parameter value of an average operating temperature of the host system, a parameter value corresponding to an estimation of an amount of time the host system will operate in temperatures exceeding 50° F., and a parameter value corresponding to an estimation of a number of write operation requests that the host system will transmit to the memory sub-system while the temperature of the automobile is below 50° F. Based on the priority of the operating requirement and the received parameter values, the processing device can determine one or more programming operation settings for a programming operation to be performed at the memory sub-system. For example, the processing device can determine to set an initial write mode of host data stored at the memory sub-system to an SLC write mode (i.e., host data is to be stored at a data block with SLCs), when host data is received when the temperature of the automobile is below 50° F. The processing device can further determine to set a subsequent write mode of host data stored at the memory sub-system to a TLC write mode (i.e., host data is to be stored at a data block with TLCs) when the temperature of the host system exceeds 50° F.

In some embodiments, the processing device can determine a parameter value threshold corresponding to at least one operating requirement of the set of operating requirements. The parameter value threshold can indicate a range of parameter values associated with an operating requirement where a first programming operation setting is to be applied to a programming operation. In response to determining that a parameter value has exceeded a parameter value threshold, the processing device can determine to apply a second programming operation setting to a programming operation. In accordance with the above described example, the processing device can determine to set the initial write mode of host data stored at the memory sub-system to an SLC write mode, and a subsequent write mode to a TLC write mode when the temperature of the host system exceeds 50° F. The processing device can further determine that, in response to the operating temperature of the host system exceeding or satisfying a parameter value threshold, such as a higher temperature (e.g., 70° F.), the subsequent write mode is to be set to a QLC write mode.

At operation 230, the processing device receives a request to perform the programming operation at the memory sub-system. For example, the host system can provide a request for the programming operation to read, write, or erase data stored at the memory sub-system. At operation 240, the processing device, in response to receiving the request to perform the programming operation, performs the programming operation at the memory sub-system based on the programming operation setting. In accordance with an above described example, the operating environment of the host system can be an automobile that operates in cold temperatures. The processing device can receive a request perform a write operation to write host data to the memory sub-system. At the time the request to perform the write operation is received, the temperature of the automobile can be below 50° F. Based on the programming operating settings determined at operation 220, the processing device can perform the write operation to write the host data to the memory sub-system in an SLC write mode.

Figure 3:
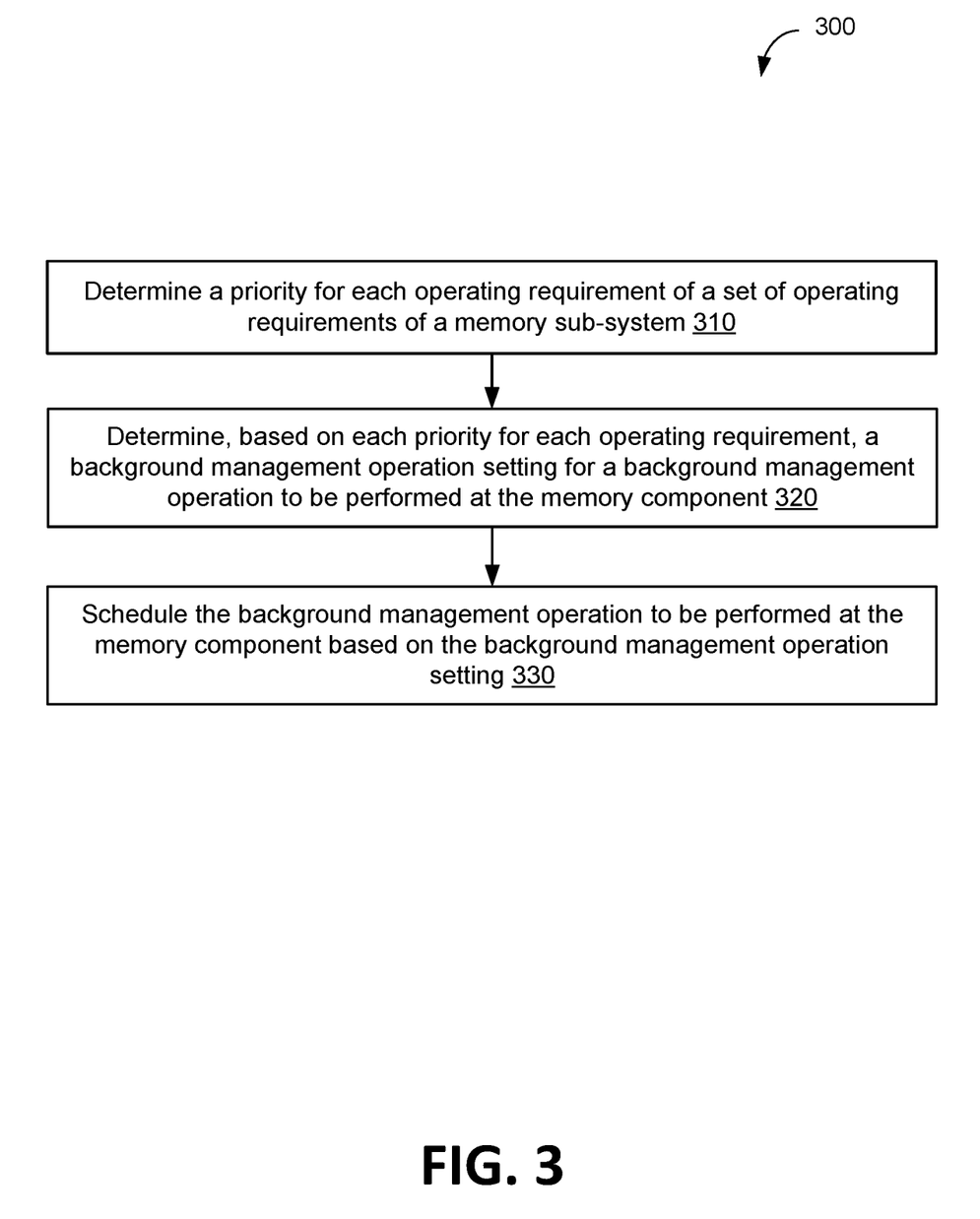
FIG. 3 is a flow diagram of an example method to adjust background management operation settings based on memory sub-system operating requirements in accordance with some embodiments of the present disclosure.

FIG. 3 is a flow diagram of an example method 300 to adjust background management operation settings based on memory sub-system operating requirements, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the operation setting component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device determines a priority for each operating requirement of a set of operating requirements of a memory sub-system. Each operating requirement of the set of operating requirements can correspond with an operating environment of a host system, such as host system 120 of FIG. 1. In some embodiments, the set of operating requirements can include at least one of an operating temperature of the memory sub-system, a time period that data is to be retained at the memory sub-system, a program performance of the memory sub-system, or an endurance of the memory sub-system. In other embodiments, the operating requirements can include any other operating requirement of a memory sub-system. As discussed with respect to FIG. 2, in some embodiments, the priority for each operating requirement can include a ranking or a weighting for each operating requirement. In other embodiments, the priority for each operating requirement can include an indication of whether each operating requirement has a priority or not.

In some embodiments, the priority for each operating requirement can be determined based on a set of operating requirement priorities received from the host system, in accordance with previously described embodiments. In other embodiments, the priority for each operating requirement can be determined based on an indication of an operating environment of the host system, as previously described. The processing device can similarly receive one or more parameters corresponding to one or more priorities for each of the set of operating requirements, as previously described.

At operation 320, the processing device determines, based on the priority for each operating requirement, a background management operation setting for a background management operation to be performed at the memory component. A background management operation can include a garbage collection operation, a data refresh operation, or a data wear leveling operation. A background management operating setting can include a frequency of a performance of each of the garbage collection operation, the data refresh operation, or the data wear leveling operation, a garbage collection operation write mode, a data refresh operation write mode, a portion of data blocks of the memory sub-system to be subject to the garbage collection operation, the data refresh operation, or the data wear leveling operation, etc. In other embodiments, the background management operation setting can include any setting corresponding to a background management operation. In some embodiments, the background management operation can also be determined based on one or more parameter values corresponding to the priority for each operating requirement received from the host system.

In an example, the operating environment of the host system can be an automobile that operates in cold temperatures (e.g., temperatures that rarely exceed 50° F.). The operating temperature of the memory sub-system can be assigned a higher priority than other operating requirements of the memory sub-system. The processing device can also have received, from the host system, a parameter value indicating an amount of time, during the operation of the automobile, when the automobile is cold. Based on the priority of the operating requirement and the received parameter value, the processing device can determine one or more background management operation settings for a background management operation to be performed at the memory sub-system. For example, the processing device can determine a frequency that a data refresh operation is to be performed at the memory sub-system. In some embodiments, the processing device can determine a parameter value threshold corresponding to at least one operating requirement of the set of operating requirements, in accordance with previously described embodiments.

At operation 330, the processing device schedules the background management operation to be performed at the memory component based on the background management operation setting. In accordance with a previously described example, the processing device, at operation 320, can determine a setting corresponding with a frequency that a data refresh operation is to be performed at the memory sub-system, based on the priority of each operation requirement and the received parameter value corresponding with the priority. Based on the determined setting, the processing device can schedule the data refresh operation to be performed at the determined frequency.

In some embodiments, the background management operation setting does not correspond with a frequency of a performance of a background management operation setting. In such embodiments, the processing device can schedule the background management operation to be performed according to a default frequency. The processing device can also cause the background management operation to be performed based on the background management operation setting determined at operation 320. For example, instead of determining a frequency that a data refresh operation is to be performed, the processing device can determine a set of data blocks of the memory sub-system that is to be subject to the data refresh operation. The processing device can schedule the data refresh operation to be performed according to a default frequency setting, where the data refresh operation is to be performed at the determined set of data blocks, based on the determined background management operation setting.

Figure 4:
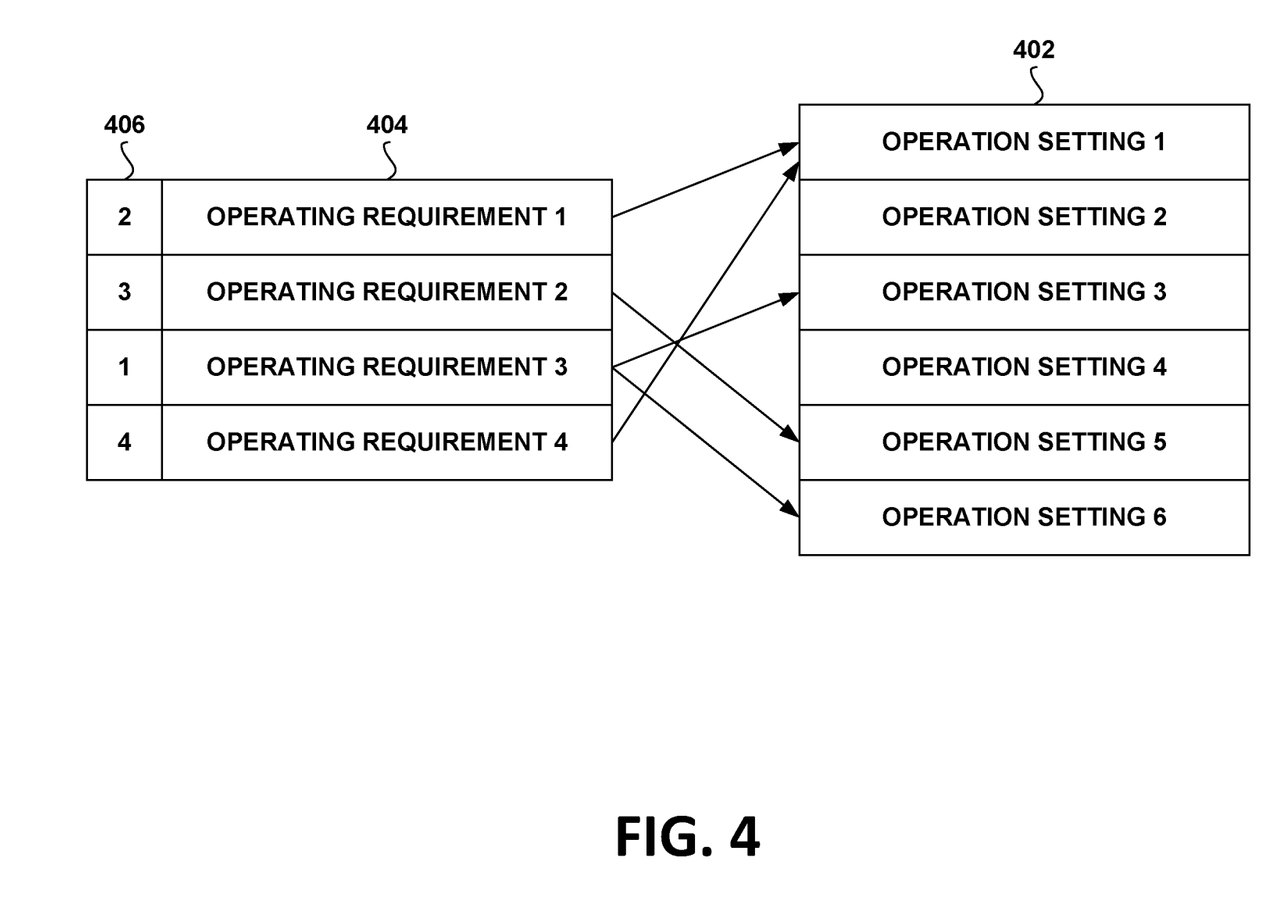
FIG. 4 illustrates adjusting memory operation settings based on memory sub-system operation requirements in accordance with some embodiments of the present disclosure.

FIG. 4 illustrates adjusting memory operation settings 402 based on memory sub-system operating requirements 404, in accordance with some embodiments of the present disclosure. Memory sub-system operating requirements 404 can each correspond with an operating environment of a host system, such as host system 120 of FIG. 1. In some embodiments, memory sub-system operating requirements 404 can include an operating temperature of the memory sub-system, a time period that data is to be retained at the memory sub-system, a program performance of the memory sub-system, or an endurance of the memory sub-system.

A priority 406 can be determined, by a processing device, for each memory sub-system operating requirement 404. In some embodiments, each priority 406 can be determined based on a set of operating requirement priorities received from the host system. In other embodiments, each priority 406 can be determined based on an indication, received from the host system, of an operating environment of the host system. In response to receiving the indication of the operating environment of the host system, each priority 406 can be assigned to each operating requirement, where a higher priority is assigned to an operating requirement that has a higher impact on a performance of the memory sub-system than other operating requirements of the set of operating requirements.

One or more memory operation settings 402 can be determined based on each priority 406 for the set of operating requirements 404. In some embodiments, memory operation settings 402 can be default operation settings. One or more default operation settings can be modified based on each priority 406 for the set of operating requirements 404, in accordance with previously described embodiments.

In one example, an operating environment of the host system can be a cellular telephone. Based on the operating environment of the host system, operating requirement 3, such as a program performance operating requirement 404, can have a higher priority 406 than other operating requirements 404, such as an operating temperature of the memory sub-system, a time period that data is to be retained at the memory sub-system, or an endurance of the memory sub-system. Therefore, as seen in the illustrated example, the priority 406 of operating requirement 3 is higher than the priorities 406 of the other operating requirements 404. Based on the priority 406 of operating requirement 3, operation setting 3 and operation setting 6 can be determined. Additionally, based on the priorities 406 for the other operating requirements 404, one or more of the operation settings 402 can be determined. For example, operating setting 1 can be determined based on the priorities 406 for operating requirement 1 and operating requirement 4. In another example, an operation setting 402 is not determined based on the priorities 406 of the one or more operating requirements 404. For example, operation setting 2 and operation setting 4 are determined based on the priorities 406 for each operating requirement 404. In such examples, operation setting 2 and operation setting 4 can be default operation settings.

Figure 5:
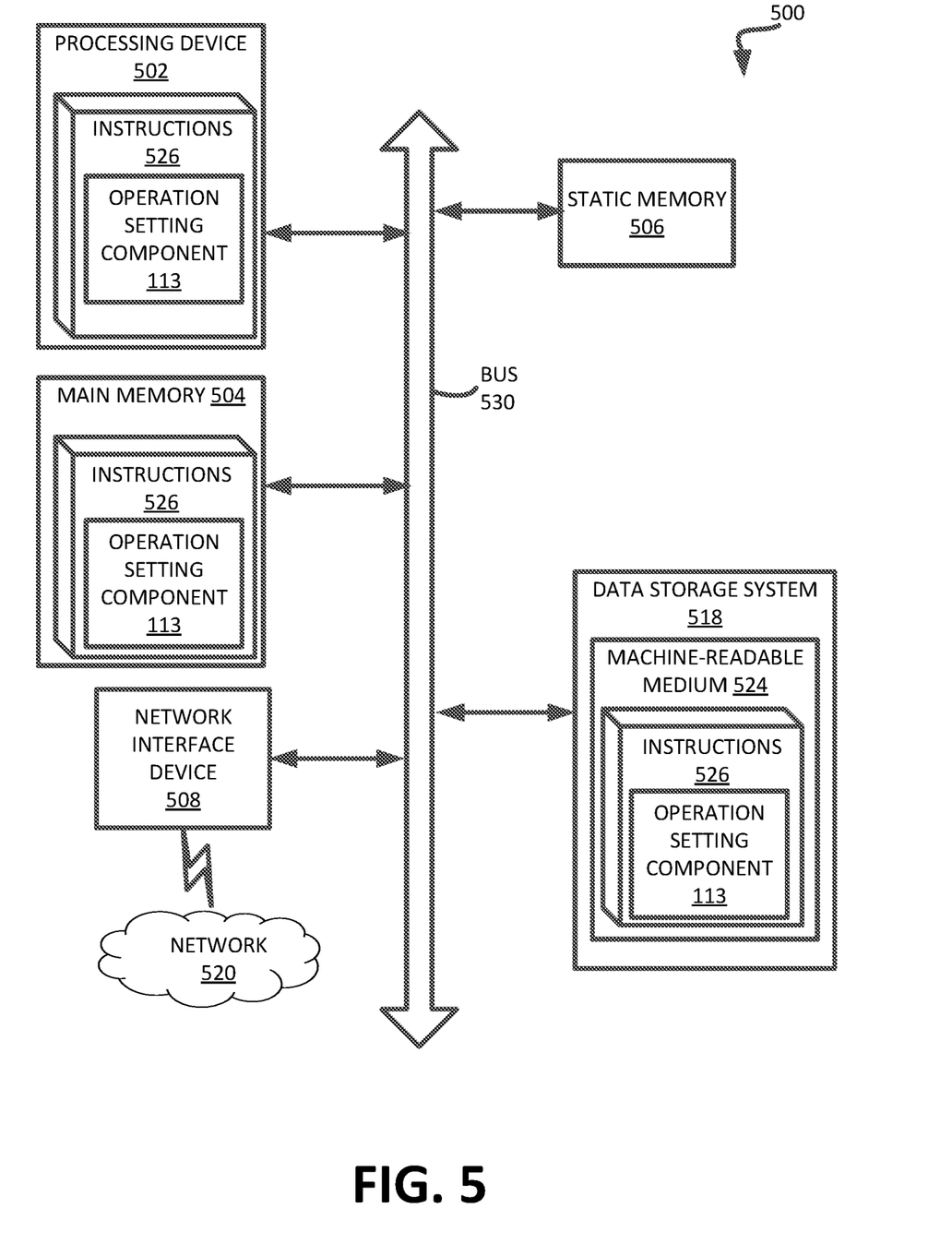
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the operation setting component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to an operation setting component (e.g., the operation setting component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
performing, by a memory sub-system controller of a memory sub-system coupled to a host system, a first set of memory access operations at the memory sub-system based on a first set of memory access operation settings, wherein the first set of memory access operation settings are configured based on a first operating environment of the host system;
detecting, by the memory sub-system controller, that the host system is operating in a second operating environment that is different from the first operating environment;
responsive to detecting that the host system is operating in the second operating environment, determining, by the memory sub-system controller, a level of impact that each operating requirement of a set of operating requirements of the memory sub-system has on a performance of the memory sub-system in view of the second operating environment;
determining, by the memory sub-system controller and based on a respective priority for each operating requirement of the set of operating requirements, a second set of memory access operation settings; and
performing, by the memory sub-system controller, a second set of memory access operations at the memory sub-system based on the second set of memory access operation settings.

2. The method of claim 1, wherein the level of impact that each operating requirement of the set of operating requirements has on the performance of the memory sub-system is determined based on a temperature difference between a first temperature of the first operating environment and a second temperature of the second operating environment.

3. The method of claim 1, further comprising:
receiving an indication of the respective priority for each operating requirement of the set of operating requirements from the host system.

4. The method of claim 1, wherein each operating requirement of the set of operating requirements is associated with a first respective priority based on the first operating environment of the host system, and wherein the method further comprises:
assigning a second respective priority to each operating requirement of the set of operating requirements based on the second operating environment of the host system, wherein the second set of memory access operations is determined based on the second respective priority for each operating requirement of the set of operating requirements.

5. The method of claim 1, wherein the respective priority for each operating requirement of the set of operating requirements comprises an indication of whether the respective operating requirements has a priority or does not have a priority.

6. The method of claim 1, wherein the set of operating requirements comprise at least one of: an operating temperature of the memory sub-system, a time period that data is to be retained at the memory sub-system, a program performance of the memory sub-system, or an endurance of the memory sub-system.

7. The method of claim 1, wherein the first set of memory access operation settings and the second set of memory access operation settings comprise at least one of an initial write mode of host data stored at the memory sub-system, a subsequent write mode of the host data stored at the memory sub-system, a read voltage, or a rate at which host data is to be written to the memory sub-system.

8. A memory sub-system comprising:
a memory device; and
a processing device, operatively coupled with the memory device, to perform operations comprising:
performing a first set of memory access operations at the memory device based on a first set of memory access operation settings, wherein the first set of memory access operation settings are configured based on a first operating environment of a host system;
detecting that the host system is operating in a second operating environment that is different from the first operating environment;
responsive to detecting that the host system is operating in the second operating environment, determining a level of impact that each operating requirement of a set of operating requirements of the memory sub-system has on a performance of the memory device in view of the second operating environment;
determining, based on a respective priority for each operating requirement of the set of operating requirements, a second set of memory access operation settings; and
performing a second set of memory access operations at the memory device based on the second set of memory access operation settings.

9. The memory sub-system of claim 8, wherein the level of impact that each operating requirement of the set of operating requirements has on the performance of the memory device is determined based on a temperature difference between a first temperature of the first operating environment and a second temperature of the second operating environment.

10. The memory sub-system of claim 8, wherein the operations further comprise:
receiving an indication of the respective priority for each operating requirement of the set of operating requirements from the host system.

11. The memory sub-system of claim 8, wherein each operating requirement of the set of operating requirements is associated with a first respective priority based on the first operating environment of the host system, and wherein the operations further comprise:
assigning a second respective priority to each operating requirement of the set of operating requirements based on the second operating environment of the host system, wherein the second set of memory access operations is determined based on the second respective priority for each operating requirement of the set of operating requirements.

12. The memory sub-system of claim 8, wherein the respective priority for each operating requirement of the set of operating requirements comprises an indication of whether the respective operating requirements has a priority or does not have a priority.

13. The memory sub-system of claim 8, wherein the set of operating requirements comprise at least one of: an operating temperature of the memory sub-system, a time period that data is to be retained at memory devices of the memory sub-system, a program performance of the memory devices of the memory sub-system, or an endurance of the memory devices of the memory sub-system.

14. A non-transitory computer readable medium comprising instructions, which when executed by a processing device, cause the processing device to perform operations comprising:
performing a first set of memory access operations at a memory sub-system based on a first set of memory access operation settings, wherein the first set of memory access operation settings are configured based on a first operating environment of a host system;
detecting that the host system is operating in a second operating environment that is different from the first operating environment;
responsive to detecting that the host system is operating in the second operating environment, determining a level of impact that each operating requirement of a set of operating requirements of the memory sub-system has on a performance of the memory sub-system in view of the second operating environment;
determining, based on a respective priority for each operating requirement of the set of operating requirements, a second set of memory access operation settings; and
performing a second set of memory access operations at the memory sub-system based on the second set of memory access operation settings.

15. The non-transitory computer readable medium of claim 14, wherein the level of impact that each operating requirement of the set of operating requirements has on the performance of the memory sub-system is determined based on a temperature difference between a first temperature of the first operating environment and a second temperature of the second operating environment.

16. The non-transitory computer readable medium of claim 14, wherein the operations further comprise:
receiving an indication of the respective priority for each operating requirement of the set of operating requirements from the host system.

17. The non-transitory computer readable medium of claim 14, wherein each operating requirement of the set of operating requirements is associated with a first respective priority based on the first operating environment of the host system, and wherein the operations further comprise:
assigning a second respective priority to each operating requirement of the set of operating requirements based on the second operating environment of the host system, wherein the second set of memory access operations is determined based on the second respective priority for each operating requirement of the set of operating requirements.

18. The non-transitory computer readable medium of claim 14, wherein the respective priority for each operating requirement of the set of operating requirements comprises an indication of whether the respective operating requirements has a priority or does not have a priority.

19. The non-transitory computer readable medium of claim 14, wherein the set of operating requirements comprise at least one of: an operating temperature of the memory sub-system, a time period that data is to be retained at the memory sub-system, a program performance of the memory sub-system, or an endurance of the memory sub-system.

20. The non-transitory computer readable medium of claim 14, wherein the first set of memory access operation settings and the second set of memory access operation settings comprise at least one of an initial write mode of host data stored at the memory sub-system, a subsequent write mode of the host data stored at the memory sub-system, a read voltage, or a rate at which host data is to be written to the memory sub-system.

* * * * *